United States Patent [19]
Chang et al.

[11] Patent Number: 6,156,671
[45] Date of Patent: Dec. 5, 2000

[54] METHOD FOR IMPROVING CHARACTERISTIC OF DIELECTRIC MATERIAL

[75] Inventors: Ting-Chang Chang, Hsinchu; Po-Tsun Liu, Tainan; Water Lur, Taipei, all of Taiwan

[73] Assignee: United Microelectronics Corp., Hsinchu, Taiwan

[21] Appl. No.: 09/266,177

[22] Filed: Mar. 10, 1999

[51] Int. Cl.$^7$ .................................................. H01L 21/31
[52] U.S. Cl. ........................................... 438/778; 438/778
[58] Field of Search ..................................... 438/780, 781, 438/788, 789, 790, 798, 253, 711, 623, 446; 437/40

[56] References Cited

U.S. PATENT DOCUMENTS

| | | |
|---|---|---|
| 5,273,920 | 12/1993 | Kwasnick et al. .................. 437/40 |
| 5,846,859 | 12/1998 | Lee ..................................... 438/253 |
| 5,953,627 | 9/1999 | Carter et al. ........................ 438/623 |
| 5,958,798 | 9/1999 | Shields .............................. 438/710 |
| 6,030,901 | 2/2000 | Hopper .............................. 438/711 |

*Primary Examiner*—David Nelms
*Assistant Examiner*—David Nhu
*Attorney, Agent, or Firm*—Thomas, Kayden, Horstemeyer & Risley

[57] ABSTRACT

A method for improving a characteristic of a dielectric material. A methylsilsesquioxane having a low dielectric constant is used as a dielectric material. A methylsilsesquioxane film is formed on a substrate. A baking process is performed on the methylsilsesquioxane film, and then a curing process is performed on the methylsilsesquioxane film. Next, a hydrogen plasma treatment is performed on the surface of the methylsilsesquioxane film to prevent the methylsilsesquioxane film from being damaged by oxygen plasma for removing photoresist layer, so that the characteristically low dielectric constant of the methylsilsesquioxane film is maintained.

17 Claims, 7 Drawing Sheets

METHOD FOR IMPROVING CHARACTERISTIC OF DIELECTRIC MATERIAL

BACKGROUND OF THE INVENTION

1. Field of the Invention

The present invention relates to a method for improving a characteristic of a dielectric material. More particularly, the present invention relates to a method for improving a characteristic of a dielectric material by hydrogen plasma.

2. Description of the Related Art

As the integration density of semiconductor devices increases, more circuit elements must be packed into a unit surface area of the device substrate, and circuit elements such as interconnects are necessarily increased between MOS transistors of the IC device. In many highly integrated semiconductor devices, more than two levels of interconnecting metal layers are necessary, called multilevel interconnects. Between these multiple metal layers, electrically insulating material known as inter-metal dielectrics are used to provide isolation between the metal layers.

In the era of deep sub-micron semiconductor fabrication, the need to minimize interconnect capacitance is becoming more important to overcome the increased RC delay which results from shrinking geometry. One method of minimizing the capacitance of the interconnect structure of a semiconductor device is to provide a dielectric material having a low dielectric constant (K) between the conductive traces of the interconnect structure.

The shrinkage of feature size in such integrated circuit structures includes reduced horizontal spacing between adjacent conductors on the same plane. However, such decrease of feature size results in a corresponding rise in the impedance of the conductors, as well as crosstalk between the conductors. Such increases in impedance in the integrated circuit structure can result in degradation of the performance of the integrated circuit structure.

In order to decrease RC delay, power and crosstalk, a methylsilsesquioxane (MSQ) film having a low dielectric constant about 2.6–2.7 is usually applied in the process of fabricating a semiconductor device. The methylsilsesquioxane film is usually formed by spin coating, so that the methylsilsesquioxane film is smooth enough. Therefore, the methylsilsesquioxane is widely applied.

Conventionally, a photoresist layer is removed by an ashing method using oxygen plasma. Removing the photoresist layer is an important part of the process of fabricating a semiconductor device. Since the semiconductor device is very small as compared to a large scale integrated circuit device (LSI) or a very large scale integrated circuit device (VLSI), the photoresist layer is hard to remove, by the usually ashing method using the oxygen plasma, without damaging the devices.

Generally, the photoresist layer is not easily etched as intended by the ashing method. In other words, the photoresist layer is hard to etch precisely so as to be able to remove only the photoresist layer without damaging any of the devices in the ashing process. Additionally, the leakage current density is increased by removal of a photoresist layer by the ashing method using the oxygen plasma, and the dielectric constant is also increased.

Figure 1A:
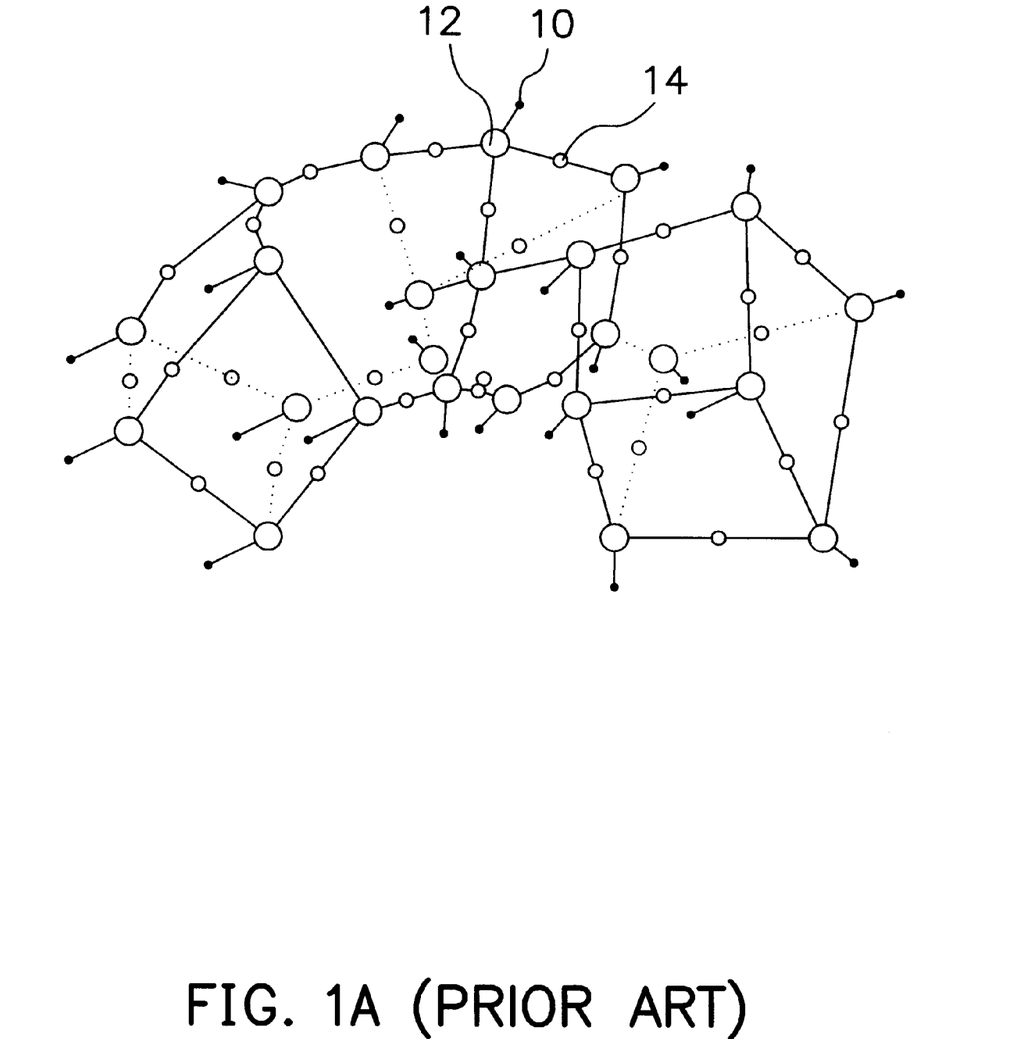
FIG. 1A is a network structure of methylsilsesquioxane.

FIG. 1A is a network structure for methylsilsesquioxane. Referring to FIG. 1A, methylsilsesquioxane comprises silicon atoms 12, oxygen atoms 14 and methyl groups 10, wherein the silicon atoms 12 and the oxygen atoms 14 make up a network structure, and the methyl group 10 links with the silicon atom 12.

Figure 1B:
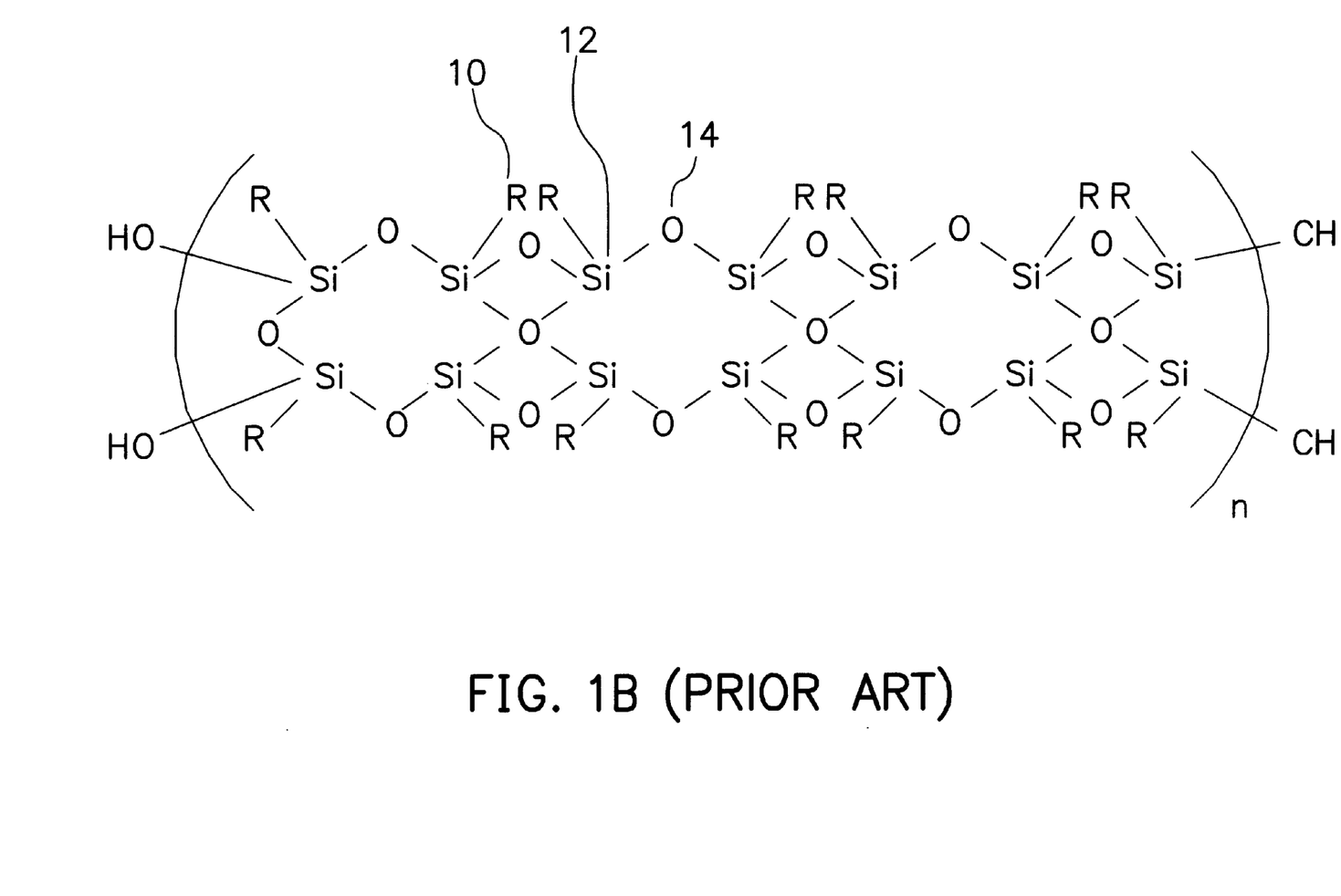
FIG. 1B is a pre unit polymer of methylsilsesquioxane.

FIG. 1B is a per unit polymer of methylsilsesquioxane. Referring to FIG. 1B, a per unit polymer of methylsilsesquioxane is made up many monomers. Each of the monomers comprises silicon atoms 12, oxygen atoms 14 and methyl groups 10, wherein the silicon atoms 12 and the oxygen atoms 14 makes up a network structure, and the methyl group 10 links with the silicon atom 12.

Figure 2:
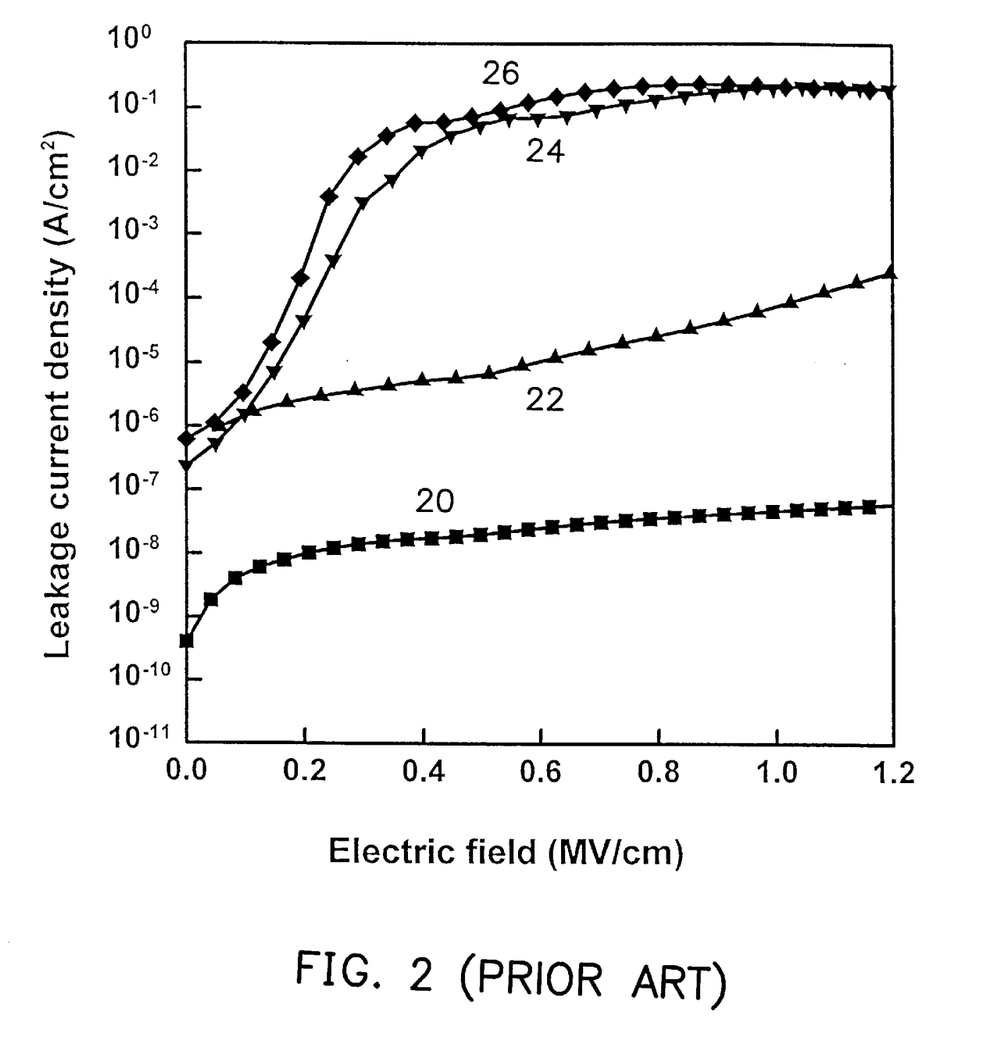
FIG. 2 shows the leakage current density of methylsilsesquioxane after oxygen plasma treatment as a function of electric field.

FIG. 2 shows the leakage current density of methylsilsesquioxane after oxygen plasma treatment as a function of electric field.

Referring to FIG. 2, curves 20, 22, 24 and 26 represent the leakage current density of methylsilsesquioxane without oxygen plasma treatment, and the methylsilsesquioxane with oxygen plasma treatment for 3 min, 6 min and 9 min as a function of an electric field, respectively. As can be seen from FIG. 2, the curve 20 is the lowest, which means that leakage current of the methylsilsesquioxane without oxygen plasma treatment is lower than that of the methylsilsesquioxane with oxygen plasma treatment. The leakage current of the methylsilsesquioxane increases as oxygen plasma treatment time is increased. In other words, the oxygen plasma destroys the characteristically low dielectric constant of the methylsilsesquioxane. As a result, the dielectric constant of methylsilsesquioxane increases as oxygen plasma treatment time increases.

SUMMARY OF THE INVENTION

Accordingly, purpose of the present invention is to provide a method for improving a characteristic of a dielectric material. The method can prevent the methylsilsesquioxane film from being damaged by oxygen plasma for removing photoresist layer, so that an increase in dielectric constant is avoided.

To achieve these and other advantages and in accordance with the purpose of the invention, as embodied and broadly described herein, the invention provides a method for improving characteristic of a dielectric material by hydrogen plasma. A methylsilsesquioxane film is formed on a substrate. A baking process is performed on the methylsilsesquioxane film, and then a curing process is performed on the methylsilsesquioxane film. Next, a hydrogen plasma treatment is performed on surface of the methylsilsesquioxane film to prevent the methylsilsesquioxane film from being damaged by oxygen plasma for removing photoresist layer, so that an increase in the dielectric constant is avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 3:
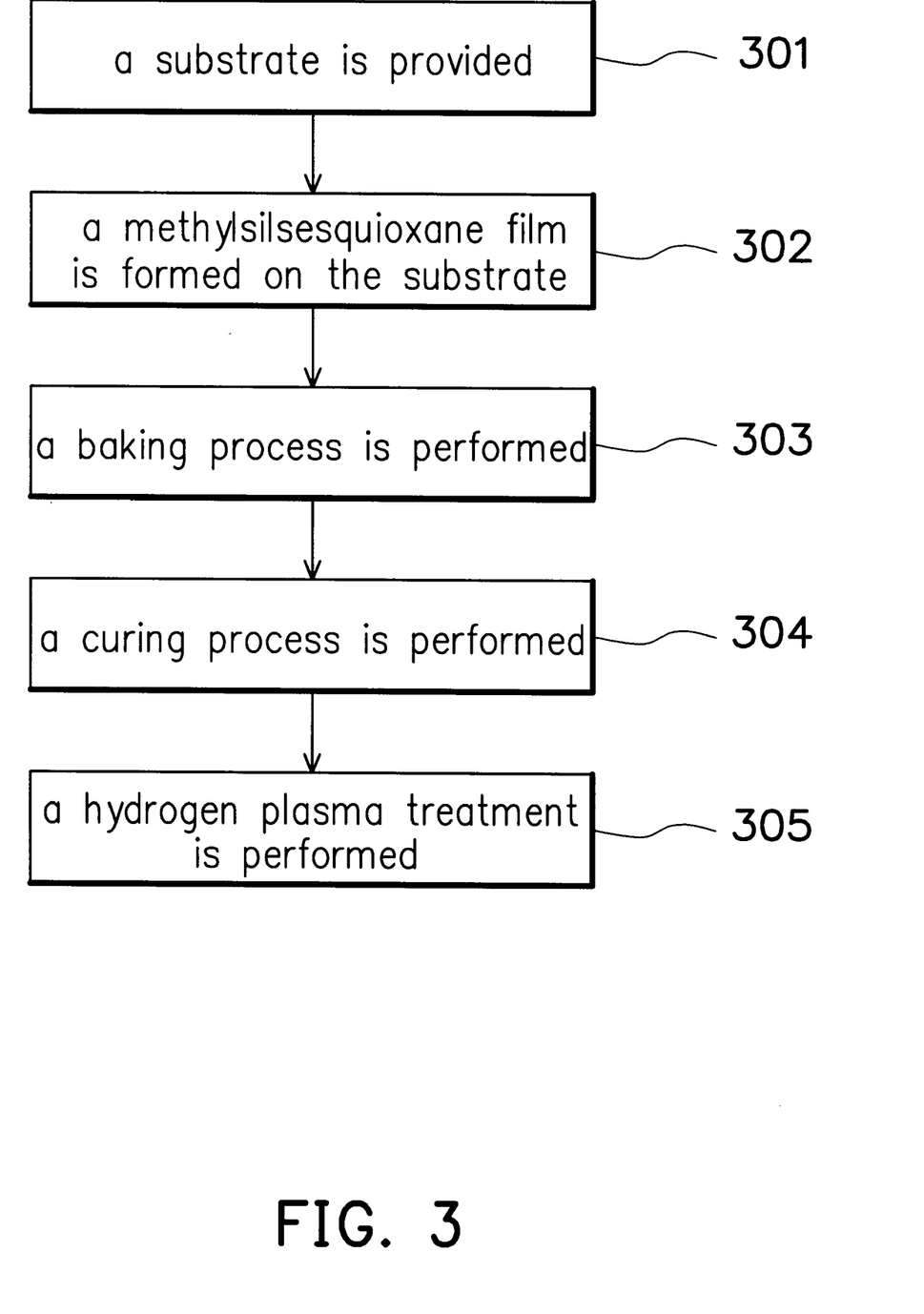
FIG. 3 is a flow chart describing various steps of the methylsilsesquioxane film deposition process in accordance with the preferred embodiment of the invention.

FIG. 3 is a flow chart describing various steps of the methylsilsesquioxane film deposition process in accordance with the preferred embodiment of the invention.

Shown as procedure 301, a substrate having devices is provided, wherein the devices, such as various semiconductor devices, an oxide layer, a trench or an electrode is formed. The technique of forming the devices is not directly related to the invention and is well known to those skilled in the art, so that detailed description is omitted herein.

Shown as procedure 302, a methylsilsesquioxane film is formed, for example, by spin coating on the substrate.

Shown as procedure 303, a baking process is performed on the methylsilsesquioxane film, wherein the baking process includes two steps. First, the methylsilsesquioxane film is baked on a hot plate at a temperature of about 160–200 degrees C, for a duration of about 1–3 min. Then, the methylsilsesquioxane film is baked on a hot plate at a temperature of about 200–300 degrees C, for a duration of about 0.5–1.5 min. The baking process is used to volatilize solvent of the methylsilsesquioxane film.

Shown as procedure 304, a curing process is performed on the methylsilsesquioxane film. The methylsilsesquioxane film is cured in a furnace at a temperature of about 350–450 degrees C, for a duration of about 25–35 min. The curing process is used to reinforce bonding of the methylsilsesquioxane film.

Shown as procedure 305, a hydrogen plasma treatment is performed on the surface of the methylsilsesquioxane film. As a consequence of the curing process distorting bonding structure of the methylsilsesquioxane film, the methylsilsesquioxane film surface has many dangling bonds. The hydrogen plasma can protect and cover the dangling bonds of the porous methylsilsesquioxane film to prevent the methylsilsesquioxane film from being damaged by oxygen plasma for removing the photoresist layer, so that an increase in dielectric constant is avoided.

Table 1 shows the treatment conditions of methylsilsesquioxane with hydrogen plasma treatment and lists the process parameters used for producing hydrogen plasma in the invention. These process parameters are optimized for the invention. However, an implementation of the invention is not limited. Other process parameters meeting the requirements of the invention are also suitable.

| Gas | Treatment Time (min) | Pressure (mtorr) | Flow Rate (sccm) | Temperature (° C.) | Power (W) |
| --- | --- | --- | --- | --- | --- |
| H$_2$ | 1~5 | 200~350 | 100~300 | 200~350 | 100~300 |

After performing the baking process and the curing process, a hydrogen plasma treatment is performed on the methylsilsesquioxane film surface. The hydrogen plasma can protect the dangling bonds of the porous methylsilsesquioxane film to form a protective layer. The protective layer avoids moisture adsorption by the methylsilsesquioxane film and prevents the methylsilsesquioxane film from being damaged by oxygen plasma ashing for removing the photoresist layer. Therefore, the characteristic of a low dielectric constant of the methylsilsesquioxane film is maintained to increase the quality of semiconductor device.

Figure 4:
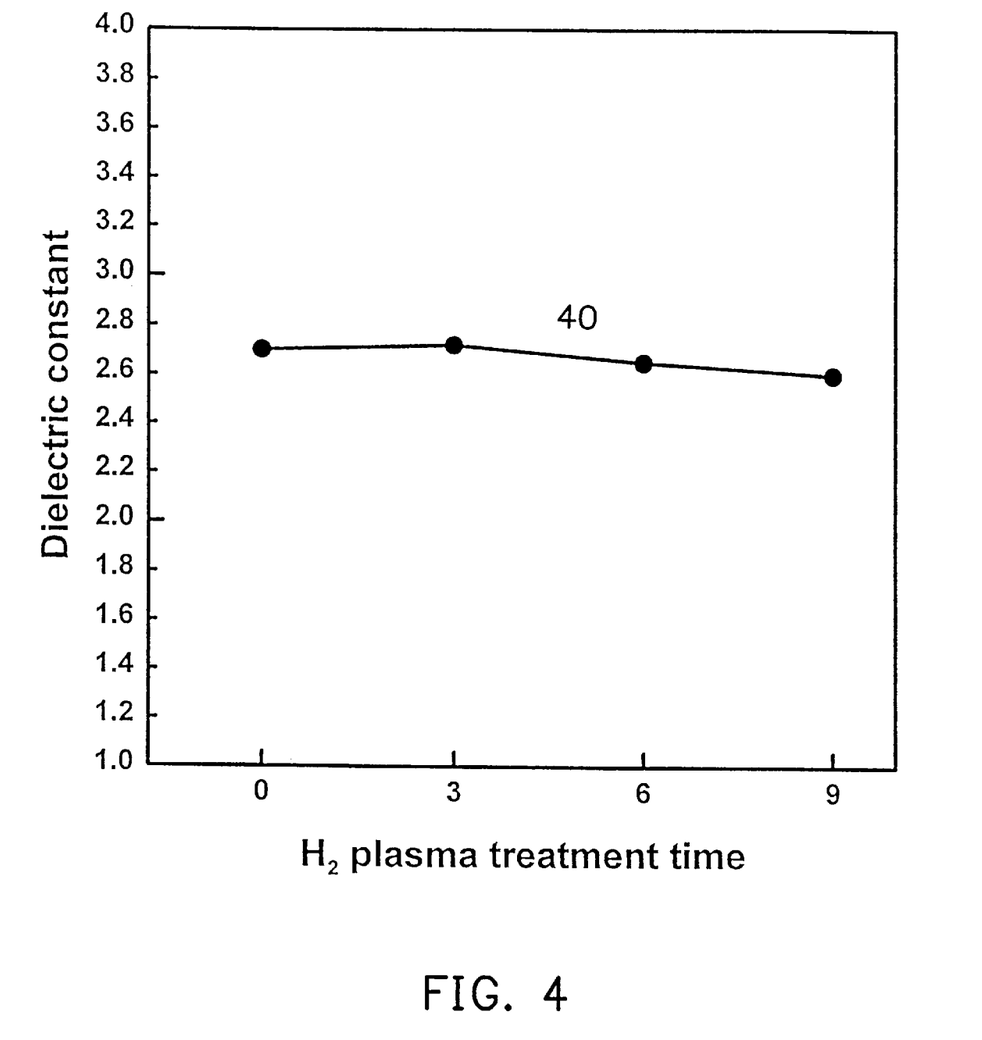
FIG. 4 shows the dielectric constant of methylsilsesquioxane as a function of hydrogen plasma treatment time.

FIG. 4 shows the dielectric constant of methylsilsesquioxane as a function of hydrogen plasma treatment time.

Referring to FIG. 4, curve 40 represents the dielectric constant of methylsilsesquioxane after the hydrogen plasma treatment for 3 to 9 min. Preferably, the hydrogen plasma treatment is performed at a temperature of about 300 degree C, while a pressure is about 300 mtorr, a flow rate of the hydrogen is set at 200 sccm, and power is about 200 W. As can be seen from FIG. 4, the dielectric constant of methylsilsesquioxane is decreased as hydrogen plasma treatment time increases. In other words, the dielectric constant of the methylsilsesquioxane with hydrogen plasma treatment is smaller than that of the methylsilsesquioxane without hydrogen plasma treatment.

Figure 5:
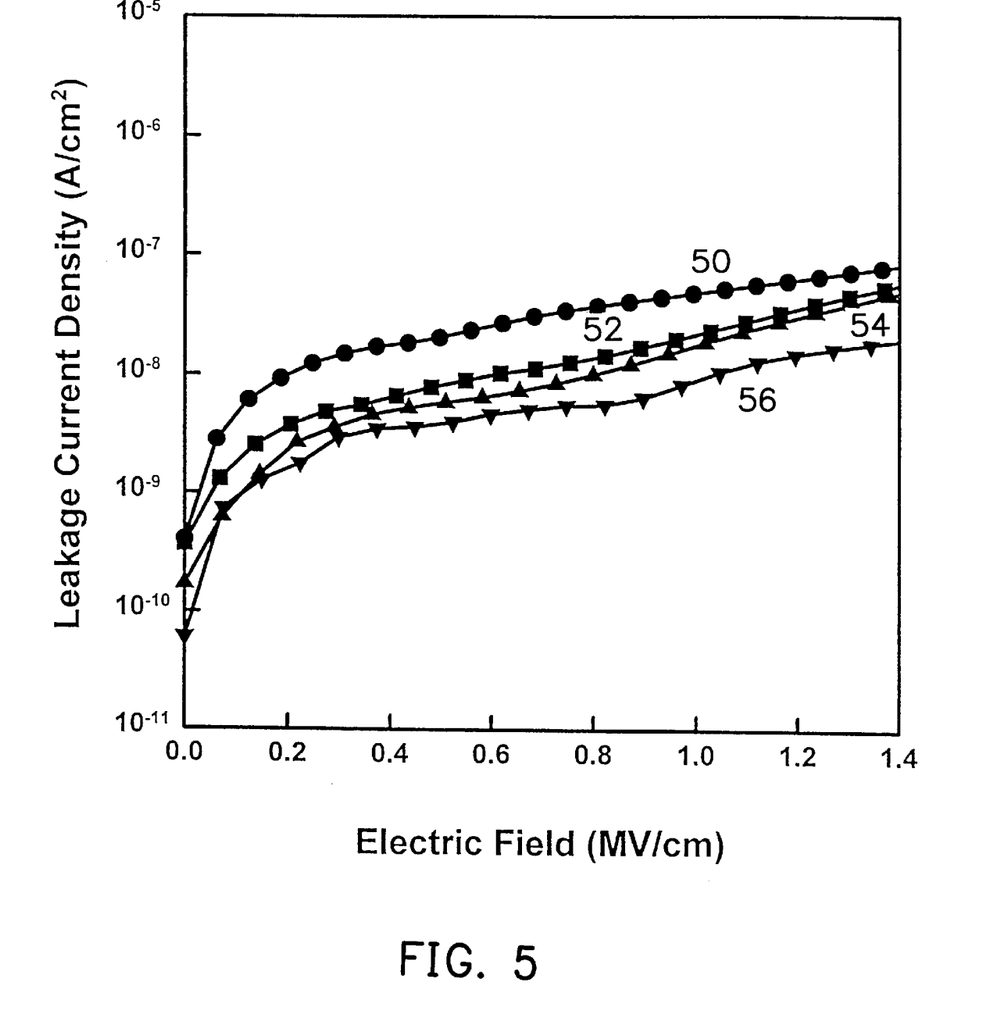
FIG. 5 shows the leakage current density of methylsilsesquioxane after hydrogen plasma treatment at 300° C. for 3 to 9 min as a function of an electric field.

FIG. 5 shows the leakage current density of methylsilsesquioxane after hydrogen plasma treatment at 300° C. for 3 to 9 min as a function of electric field.

Referring to FIG. 5, curves 50, 52, 54 and 56 represent the leakage current density of methylsilsesquioxane film without hydrogen plasma treatment, and the methylsilsesquioxane film with hydrogen plasma treatment for 3 min, 6 min and 9 min, respectively, as a function of an electric field. The leakage current of the methylsilsesquioxane film decreases as hydrogen plasma treatment time increases. In other words, a characteristic of a low dielectric constant of the methylsilsesquioxane film is maintained and the quality of the methylsilsesquioxane film is enhanced by the hydrogen plasma.

Figure 6:
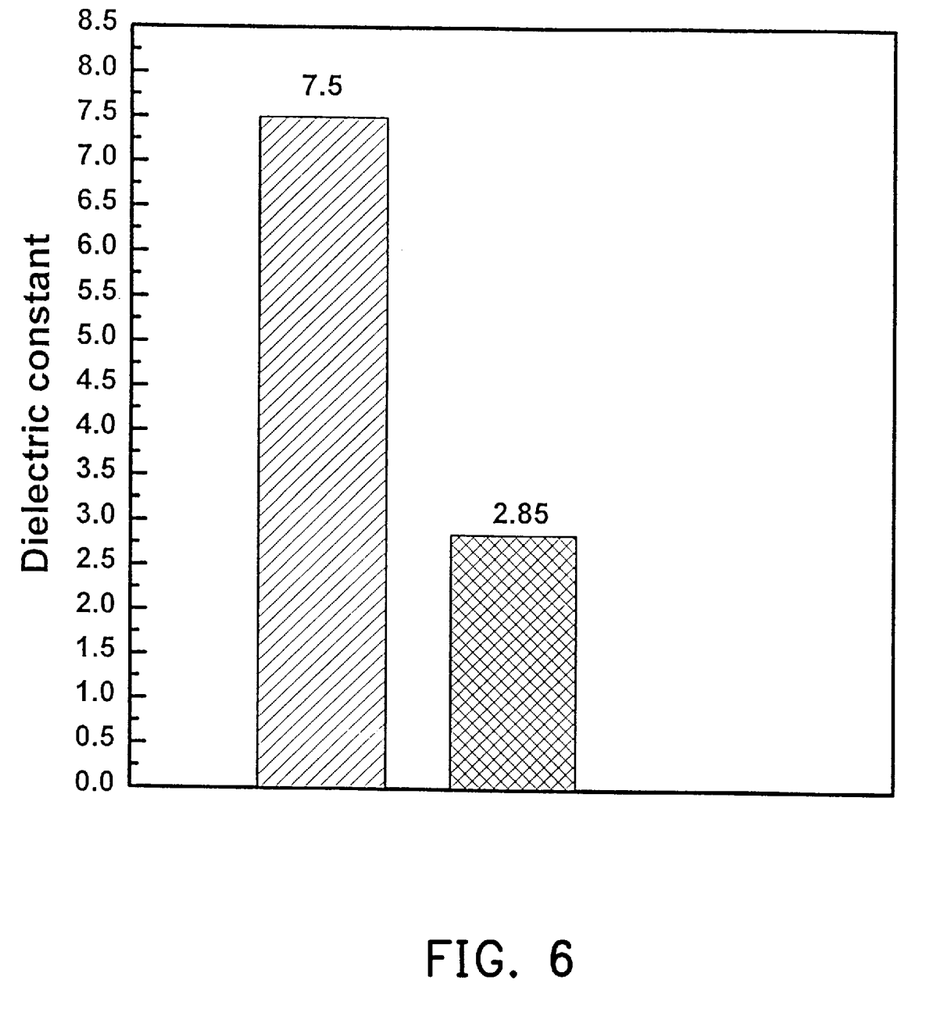
FIG. 6 is a bar diagram showing the dielectric constant of methylsilsesquioxane with hydrogen plasma treatment for 9 min followed by oxygen plasma ashing for 3 min, and the dielectric constant of methylsilsesquioxane with oxygen plasma ashing for 3 min.

FIG. 6 is a bar diagram showing the dielectric constant of methylsilsesquioxane with hydrogen plasma treatment for 9 min followed by oxygen plasma ashing for 3 min, and the dielectric constant of methylsilsesquioxane with oxygen plasma ashing for 3 min.

Referring to FIG. 6, the dielectric constant of methylsilsesquioxane film with oxygen plasma treatment for 3 min is larger than that of methylsilsesquioxane film with hydrogen plasma treatment for 9 min and followed by oxygen plasma ashing for 3 min. The dielectric constant of methylsilsesquioxane with oxygen plasma treatment for 3 min is about 7.5 because the methylsilsesquioxane film is damaged by oxygen plasma. The dielectric constant of methylsilsesquioxane with hydrogen plasma treatment and followed by oxygen plasma ashing is maintained about 2.85. In other words, the characteristic of a low dielectric constant of the methylsilsesquioxane film is maintained and quality of the methylsilsesquioxane film is enhanced by the hydrogen plasma.

The invention provides a method for improving a characteristic of a dielectric material by hydrogen plasma. After performing the baking process and the curing process, a hydrogen plasma treatment is performed on the methylsilsesquioxane film surface. The hydrogen plasma can protect the dangling bonds of the porous methylsilsesquioxane film to form a protective layer. The protective layer avoids moisture adsorption by the methylsilsesquioxane film and prevents the methylsilsesquioxane film from being damaged by oxygen plasma ashing for removing a photoresist layer. Therefore, the characteristic of a low dielectric constant of the methylsilsesquioxane film is maintained to increase process speed of a semiconductor device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for improving a characteristic of a dielectric material, comprising the steps of:

providing a substrate;

forming a dielectric material on the substrate;

performing a baking process on the dielectric material;

performing a curing process on the dielectric material; and performing a hydrogen plasma treatment on the dielectric material to form a protective layer on the dielectric material surface.

2. The method of claim 1, the baking process having two steps, wherein a first step is performed about 1–3 min at a temperature of about 160–200° C. and a second step is performed about 0.5–1.5 min at a temperature of about 200–300° C.

3. The method of claim 1, wherein the curing process takes place at a temperature of about 350–450° C.

4. The method of claim 1, wherein the curing process lasts for about 25–35 min.

5. The method of claim 1, wherein the curing process causes dangling bonds in the dielectric material, and the protective layer is formed by the hydrogen plasma to protect and cover the dangling bonds in the dielectric material.

6. The method of claim 1, wherein the dielectric material includes methylsilsesquioxane.

7. A method for improving a characteristic of a dielectric material, which is used for a methylsilsesquioxane film, comprising the steps of:

curing the methylsilsesquioxane; and performing a hydrogen plasma treatment on the methylsilsesquioxane.

8. The method of claim 7, wherein before the step of curing the methylsilsesquioxane further includes a step of baking the methylsilsesquioxane.

9. The method of claim 7, in which the baking process has two steps, wherein the first step is performed for about 1–3 min at a temperature of about 160–200° C., and the second step is performed at about 0.5–1.5 min at a temperature of about 200–300° C.

10. The method of claim 7, wherein the curing process is performed at a temperature of about 350–450° C.

11. The method of claim 7, wherein the curing process lasts for about 25–35 min.

12. The method of claim 7, wherein the step of performing hydrogen plasma treatment on the methylsilsesquioxane is used to form a protective layer on a surface of the methylsilsesquioxane.

13. A method for improving a characteristic of a dielectric material, which is used for semiconductor device process, comprising the steps of:

providing a substrate;

forming a methylsilsesquioxane film on the substrate;

performing a baking process on the methylsilsesquioxane film;

performing a curing process on the methylsilsesquioxane film; and performing a hydrogen plasma treatment on the methylsilsesquioxane film to form a protective layer on a surface of the methylsilsesquioxane film.

14. The method of claim 13, in which the baking process has two steps, wherein the first step is performed for about 1–3 min at a temperature of about 160–200 ° C., and the second step is performed for about 0.5–1.5 min at a temperature of about 200–300° C.

15. The method of claim 13, wherein the curing process is performed at a temperature of about 350–450° C.

16. The method of claim 13, wherein the curing process lasts for about 25–35 min.

17. The method of claim 13, wherein the curing process causes dangling bonds in the methylsilsesquioxane film and the protective layer is formed by the hydrogen plasma to protect the dangling bonds in the methylsilsesquioxane film.

\* \* \* \* \*